(12) United States Patent
Lotfi et al.

(10) Patent No.: US 6,218,891 B1
(45) Date of Patent: Apr. 17, 2001

(54) INTEGRATED CIRCUIT INCLUDING A DRIVER FOR A METAL-SEMICONDUCTOR FIELD-EFFECT TRANSISTOR

(75) Inventors: Ashraf W. Lotfi, Bridgewater, NJ (US); Allen F. Rozman, Richardson, TX (US); Jian Tan, Bridgewater, NJ (US); Wei Tang, Plano, TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/628,266

(22) Filed: Jul. 28, 2000

(51) Int. Cl.$^7$ .................................................. H03K 17/687
(52) U.S. Cl. ........................ 327/431; 257/280; 363/21; 363/25; 363/89; 363/127
(58) Field of Search ................................. 363/15, 21, 25, 363/89, 127; 257/280; 327/431

(56) References Cited

U.S. PATENT DOCUMENTS

| | | | |
|---|---|---|---|
| Re. 36,571 | 2/2000 | Rozman | 363/21 |
| 4,899,271 | 2/1990 | Seiersen | 363/126 |
| 5,274,543 | 12/1993 | Loftus, Jr. | 363/127 |
| 5,291,382 | 3/1994 | Cohen | 363/16 |
| 5,303,138 | 4/1994 | Rozman | 363/89 |
| 5,434,768 | 7/1995 | Jitaru et al. | 363/21 |
| 5,481,219 * | 1/1996 | Jacobs et al. | 327/434 |
| 5,528,482 | 6/1996 | Rozman | 363/21 |
| 5,541,828 | 7/1996 | Rozman | 363/21 |
| 5,590,032 | 12/1996 | Bowman et al. | 363/15 |
| 5,625,541 | 4/1997 | Rozman | 363/21 |
| 5,870,299 | 2/1999 | Rozman | 363/127 |
| 5,920,475 | 7/1999 | Boylan et al. | 363/127 |
| 5,940,287 | 8/1999 | Brkovic | 363/127 |
| 5,956,245 | 9/1999 | Rozman | 363/89 |
| 6,002,597 | 12/1999 | Rozman | 363/21 |
| 6,011,703 | 1/2000 | Boylan et al. | 363/21 |

OTHER PUBLICATIONS

U.S. Patent Application Ser. No. 09/072,370 to Bowman, et al.; filed May 4, 1998, entitled "Self–Synchronized Drive Circuit for a Synchronous Rectifier in a Clamped–Mode Power Converter".

U.S. Patent Application Ser. No. 09/176,690 to Jacobs, et al.; filed Oct. 21, 1998, entitled "Drive Compensation Circuit for Synchronous Rectifier and Method of Operating the Same".

U.S. Patent Application Ser. No. 08/872,250 to Kossives, et al.; filed Jun. 10, 1997, entitled "A Micromagnetic Device for Power Processing Applications and Method of Manufacture Therefor".

(List continued on next page.)

Primary Examiner—Shawn Riley

(57) ABSTRACT

An integrated circuit including a metal-semiconductor field-effect transistor (MESFET) having a nominal intrinsic capacitance and requiring a negative voltage to bias the MESFET into a non-conduction state, a method of driving the MESFET and a power converter employing the integrated circuit and method. In one embodiment, the integrated circuit includes a driver including a bias capacitor integrated with the MESFET. The driver is configured to apply a positive voltage to bias the MESFET into a conduction state, and apply the negative voltage to bias the MESFET into the non-conduction state without employing an external negative bias source.

21 Claims, 4 Drawing Sheets

OTHER PUBLICATIONS

"Optimum Silicon and GaAs Power Field–Effect Transistors for Advanced High–Density, High–Frequency Power Supply Applications" by K. Shenai, C.S. Korman and B. J. Baliga; HFPC May 1989; pp. 32–60.

"A Comparison of Silicon UMOSFETs Versus GaAs Vertical FETs for Low Voltage, Synchronous Rectification at 2.5 MHz[1]" by Robert Kollman, Guy Sills, James Yuan, Tsengyou Syau, Prasad Venkatraman and B. Jayant Baliga; HFPC May 1992; pp. 113–122.

"Comparison of GaAs and Silicon Synchronous Rectifiers in a 3.3V Out, 50W DC–DC Converter" by Van A. Niemela and Wayne C. Bowman; 1996 IEEE; pp. 861–867, No Month.

"A Low On–Resistance, High–Current GaAs Power VFET" by D. L. Plumton, H. T. Yuan, T. S. Kim, A. H. Taddiken, V. Ley, R. L. Kollman, I. Lagnado and L. Johnson; 1995 IEEE; pp. 142–144, No Month.

"10 MHz PWM Converters With GaAs VFETs" by Robert Kollman, Greg Collins and Don Plumton; 1996 IEEE; pp. 264–269, No Month.

* cited by examiner

INTEGRATED CIRCUIT INCLUDING A DRIVER FOR A METAL-SEMICONDUCTOR FIELD-EFFECT TRANSISTOR

CROSS-REFERENCE TO RELATED APPLICATIONS AND PATENTS

This application is related to the following U.S. patents and applications:

| Reference No. | Title | Inventor(s) | Date |
|---|---|---|---|
| 09/072,370 ('370 application) | Self-synchronized Drive Circuit for a Synchronous Rectifier in a Clamped-mode Power Converter | Bowman, et al. | May 4, 1998 |
| 09/176,690 ('690 application) | Drive Compensation Circuit for Synchronous Rectifier and Method of Operating the Same | Jacobs, et al. | Oct. 21, 1998 |
| 4,899,271 ('271 patent) | Power Supply Circuit | Seiersen | Feb. 6, 1990 |
| 5,274,543 ('543 patent) | Zero-Voltage Switching Power Converter with Lossless Synchronous Rectifier Gate Drive | Loftus | Dec. 28, 1993 |
| 5,291,382 ('382 patent) | Pulse Width Modulated DC/DC Converter with Reduced Ripple Current Component Stress and Zero Voltage Switching Capability | Cohen | March 1, 1994 |
| 5,303,138 ('138 patent) | Low Loss Synchronous Rectifier for Application to Clamped-Mode Power Converters | Rozman | April 12, 1994 |
| 5,434,768 ('768 patent) | Fixed Frequency Converter Switching at Zero Voltage | Jitaru, et al. | July 18, 1995 |
| 5,528,482 ('482 patent) | Low Loss Synchronous Rectifier for Application to Clamped-Mode Power Converters | Rozman | June 18, 1996 |
| 5,541,828 ('828 patent) | Multiple Output Converter with Continuous Power Transfer to an Output and with Multiple Output Regulation | Rozman | July 30, 1996 |
| 5,590,032 ('032 patent) | Self-Synchronized Drive Circuit for a Synchronous Rectifier in a Clamped-Mode Power Converter | Bowman, et al. | Dec. 31, 1996 |
| 5,625,541 ('541 patent) | Low Loss Synchronous Rectifier for Application to Clamped-Mode Power Converters | Rozman | April 29, 1997 |
| 08/872,250 ('250 application) | A Micromagnetic Device for Power Processing Applications And Method of Manufacture Therefor | Kossives, et al. | June 10, 1997 |
| 5,870,299 ('299 patent) | Method and Apparatus for Damping Ringing in Self-driven Synchronous Rectifiers | Rozman | Feb. 9, 1999 |
| 5,920,475 ('475 patent) | Circuit and Method for Controlling a Synchronous Rectifier Converter | Boylan, et al. | July 6, 1999 |
| 5,940,287 ('287 patent) | Controller for a Synchronous Rectifier and Power Converter Employing the same | Brkovic | Aug. 17, 1999 |
| 5,956,245 ('245 patent) | Circuit and Method for Controlling a Synchronous Rectifier Converter | Rozman | Sept. 21, 1999 |
| 6,002,597 ('597 patent) | Synchronous Rectifier having Dynamically Adjustable Current Rating and Method of Operation Thereof | Rozman | Dec. 14, 1999 |
| 6,011,703 ('703 patent) | Self-synchronized Gate Drive for Power Converter Employing Self-driven Synchronous Rectifier and Method of Operation Thereof | Boylan, et al. | Jan. 4, 2000 |
| RE 36,571 ('571 patent) | Low Loss Synchronous Rectifier for Application to Clamped-mode Power Converters | Rozman | Feb. 15, 2000 |

The above-listed patents and applications are incorporated herein by reference as if reproduced herein in their entirety.

TECHNICAL FIELD OF THE INVENTION

The present invention is directed, in general, to integrated circuits and, more specifically, to an integrated circuit including a driver for a metal-semiconductor field-effect transistor and a power converter employing the integrated circuit.

BACKGROUND OF THE INVENTION

A power converter is a power processing circuit that converts an input voltage waveform into a specified output voltage waveform. In many applications requiring a DC output, switched-mode DC-DC converters are frequently employed to advantage. DC-DC converters generally include an inverter, a transformer having a primary winding coupled to the inverter and a rectifier coupled to a secondary winding of the transformer. The inverter generally includes a switching device that converts the DC input voltage to an AC voltage. The transformer then transforms the AC voltage to another value and the rectifier generates the desired DC voltage at the output of the DC-DC converter.

Conventionally, the switching device used in the inverter is a controllable switch such as a metal-oxide semiconductor field-effect transistor (MOSFET). The controllable switch in the inverter is modulated by periodically being driven into conduction and non-conduction states to maintain a required output voltage for the power converter. The rectifier may include passive rectifying devices that conduct the load current only when forward-biased in response to the input waveform to the rectifier. Passive rectifying devices, however, generally cannot achieve forward voltage drops that are low enough to provide a desired conversion efficiency of the DC-DC converter. To achieve a higher level of efficiency, DC-DC converters may therefore use synchronous rectifiers.

A synchronous rectifier replaces the passive rectifying devices of the conventional rectifier with a controllable switch. This controllable switch is also periodically driven into conduction and non-conduction states in synchronism with the periodic waveform of the AC voltage. The rectifier switches typically exhibit resistive-conductive properties and may thereby avoid the higher forward voltage drops inherent in the passive rectifying devices.

A metal-semiconductor field-effect transistor (MESFET) may be used as a controllable switch. The MESFET consists of a conducting channel positioned between a source and drain contact region. A carrier flowing from the source to the drain is controlled by a Schottky metal gate. Control of the channel is accomplished by varying the depletion layer width underneath the metal contact which modulates the thickness of the conducting channel and thereby the current.

A key advantage of the MESFET is the higher mobility of the carriers in the channel as compared to a MOSFET. The higher mobility leads to a higher current, transconductance and transit frequency for the device. A higher transit frequency makes the MESFET of particular interest for higher frequency applications. The use of a Gallium-Arsenide metal-semiconductor field-effect transistor (GaAsMESFET) rather than a Silicon MESFET provides additional advantages in that the room temperature mobility is more than five times larger and the saturation velocity is about twice that of Silicon. These qualities make the GaAsMESFET particularly attractive for use as a switching device in high speed applications requiring low losses. For a better understanding of Gallium-Arsenide devices see "Optimum Silicon and GaAs Power Field-Effect Transistors for Advanced High-Density, High Frequency Power Supply Applications," by K. Shenai, C. Korman, and B. Baliga, HFPC 1989, and "10 MHz PWM Converters With GaAs VFETs", by R. Kollman, G. Collins, and D. Plumton, APEC 1996, both of which are incorporated herein by reference.

Unlike the MOSFET in switching applications, however, the MESFET structure contains the Schottky metal gate. The Schottky metal gate limits the forward bias voltage on the gate to the turn-on voltage of a Schottky diode, which may be about 0.7 volts for Gallium-Arsenide. Therefore, the gate of a MESFET responds as a forward biased diode when the MESFET is used as a switch and in its conducting state. Additionally, the MESFET requires a bias voltage of an appropriate polarity to force it into a non-conducting state, since the MESFET conducts for a gate-to-source voltage of zero volts. As a result of these characteristics, it is difficult to use the MESFET as a controllable switch in many power converters since driver circuits and sources of appropriate bias supply voltages are often complex and more difficult to construct.

Accordingly, what is needed in the art is a driver for a MESFET that resolves the deficiencies and reduces the complexity associated with the prior art driver circuits.

SUMMARY OF THE INVENTION

To address the above-discussed deficiencies of the prior art, the present invention provides an integrated circuit including a metal-semiconductor field-effect transistor (MESFET) having a nominal intrinsic capacitance and requiring a negative voltage to bias the MESFET into a non-conduction state, a method of driving the MESFET and a power converter employing the integrated circuit and method. In one embodiment, the integrated circuit includes a driver including a bias capacitor integrated with the MESFET. The driver is configured to apply a positive voltage to bias the MESFET into a conduction state, and apply the negative voltage to bias the MESFET into the non-conduction state without employing an external negative bias source.

The present invention introduces, in one aspect, the concept of eliminating an external bias supply that would otherwise be required to drive the MESFET. Elimination of the external bias supply is highly beneficial in that the MESFET may be more advantageously employed in situations that would otherwise require complicated bias circuits. The driver including the bias capacitor to provide the required bias voltage on a "dynamic" basis resolves a long felt need in the application of MESFETs. Although the cited voltage polarities are directed toward an N-Channel MESFET device, the principles of the present invention may be applied to a P-Channel MESFET as well.

In one embodiment of the present invention, the driver is coupled to a control terminal of the MESFET and further includes at least one diode. In a related, but alternative embodiment, the at least one diode is parallel-coupled to the bias capacitor. The quantity and placement of the diode(s) regulate the amount of bias voltage that the driver may supply to the MESFET and allow tailoring of the bias voltage to specific MESFET requirements.

In one embodiment of the present invention, the MESFET is a Gallium-Arsenide metal-semiconductor field-effect transistor (GaAsMESFET). Use of the driver with a GaAsMESFET is particularly advantageous in that the switching speeds normally encountered in GaAsMESFET applications are very high. Since the driver provides a dynamic bias voltage to the GaAsMESFET that may otherwise deteriorate over an extended time period, high speed switching applications are particularly well suited for the application of GaAsMESFETs in accordance with the principles of the invention.

In one embodiment of the present invention, the integrated circuit forms a portion of a power converter. In a related, but alternative embodiment, the power converter is selected from the group consisting of a boost power converter, a buck power converter and a buck-boost power converter. The present invention is equally applicable to isolated and non-isolated power converter topologies. Of course, use in or with other power converter topologies or other applications is well within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
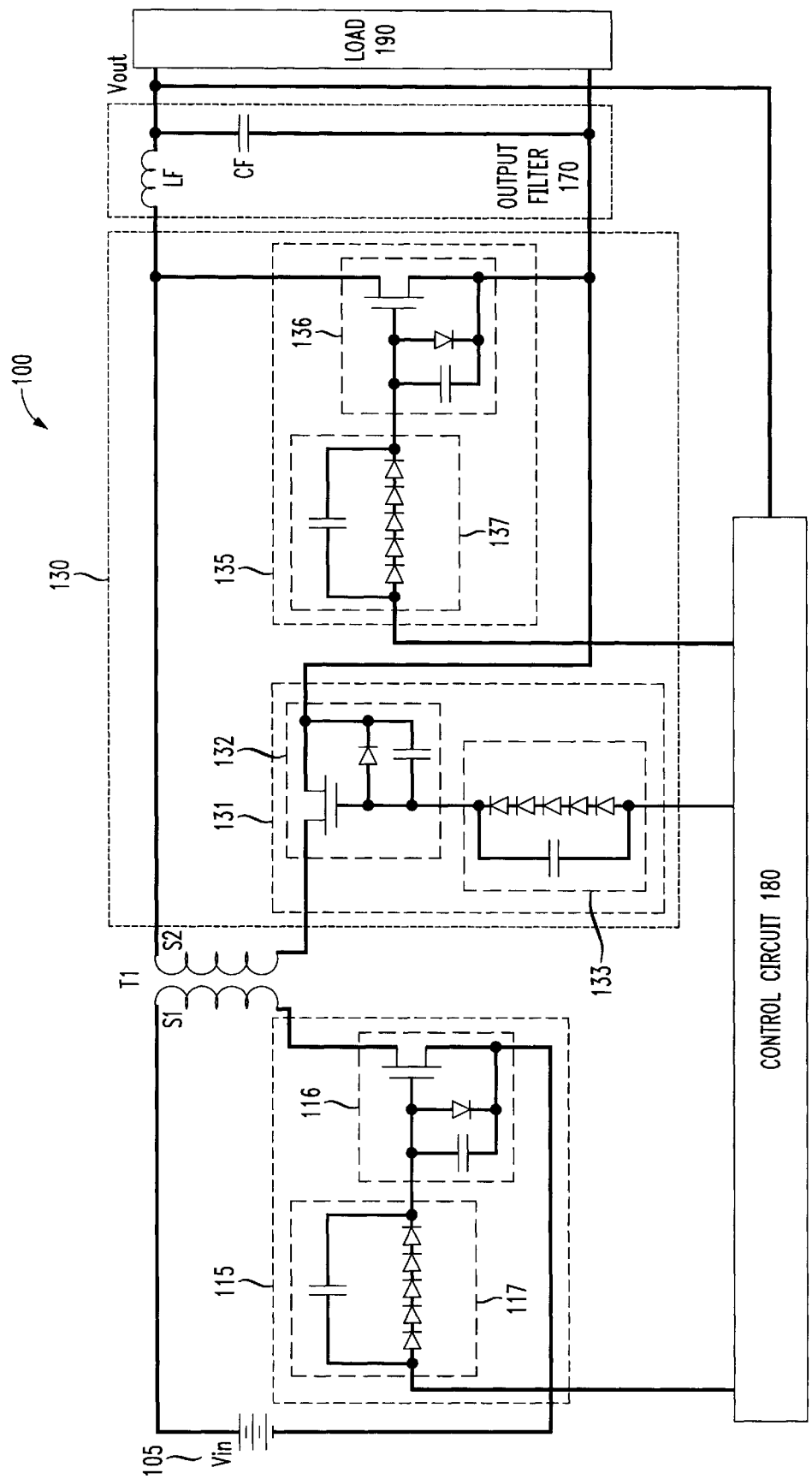
FIG. 1 illustrates a schematic diagram of an embodiment of a power converter constructed according to the principles of the present invention.

Referring initially to FIG. 1, illustrated is a schematic diagram of an embodiment of a power converter 100 constructed according to the principles of the present invention. The power converter 100 has an input couplable to a source of electrical power 105 having an input voltage Vin and an output that provides an output voltage Vout to a load 190. The power converter 100 includes an inverter with an integrated circuit (e.g., a power switch integrated circuit) 115 coupled to the input. In the illustrated embodiment, the power switch integrated circuit 115 includes a power metal-semiconductor field-effect transistor (MESFET) 116 and a power MESFET driver 117 coupled to the input of the power converter 100.

A transformer T1 of the power converter 100 includes a primary winding S1 coupled to the power switch integrated circuit 115 and a secondary winding S2 coupled to a rectifier 130. The rectifier 130 includes first and second integrated circuits (e.g., first and second rectifier switch integrated circuits) 131, 135, which cooperate to perform together as a synchronous rectifier. The first rectifier switch integrated circuit 131 includes a first rectifier MESFET 132 and a first rectifier MESFET driver 133, and the second rectifier switch integrated circuit 135 includes a second rectifier MESFET 136 and a second rectifier MESFET driver 137.

The rectifier 130 is coupled to the secondary winding S2 and rectifies a periodic waveform supplied by the secondary winding S2. The power converter 100 further includes an output filter 170 that is coupled between the rectifier 130 and the load 190. The output filter 170 has a filter inductor LF and a filter capacitor CF, that filters the rectified waveform to provide the output voltage Vout at the output of the power converter 100. The power converter 100 still further includes a control circuit 180, coupled to the power switch integrated circuit 115, that monitors the output voltage Vout and adjusts the switching cycles of the power MESFET 116 to regulate the output voltage Vout despite variations in the input voltage Vin or the load 190. The control circuit 180 is further coupled to the first and second rectifier switch integrated circuits 131, 135 of the rectifier 130 and functions to controllably switch and rectify the periodic waveform supplied by the secondary winding S2. Of course, the control circuit 180 may monitor other control points within the power converter 100 as required.

In operating the power converter 100, the control circuit 180 periodically switches the power MESFET 116 of the power switch integrated circuit 115 to apply the input voltage Vin across the primary winding S1. During steady-state operation, the power MESFET 116 is ON (conducting) for a primary duty cycle D to apply the input voltage (e.g., a DC input voltage) Vin across the primary winding S1. The first rectifier MESFET 132 and the second rectifier MESFET 136 of the rectifier 130 are also periodically switched ON and OFF in a complementary manner to deliver an appropriate rectified voltage to the output filter 170.

While the embodiment illustrated and described depicts a forward power converter topology, the principles of the present invention are equally applicable to other topologies such as a buck power converter or a buck-boost power converter, including but not limited to a full bridge, half bridge, push-pull, flyback, etc. Additionally, those skilled in the art will realize that the principles of the present invention may be employed with a wide variety of switching topologies, including those not specifically described herein.

Figure 2:
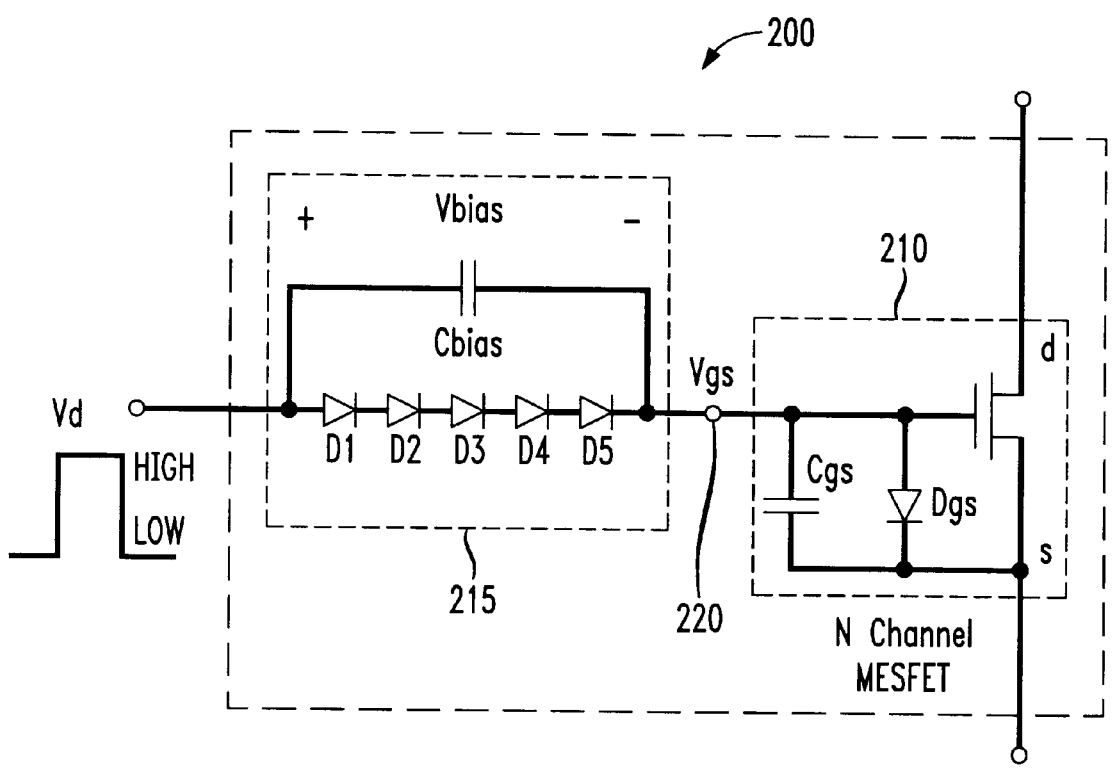
FIG. 2 illustrates a schematic diagram of an integrated circuit constructed according to the principles of the present invention.

Turning now to FIG. 2, illustrated is a schematic diagram of an embodiment of an integrated circuit 200 constructed according to the principles of the present invention. The integrated circuit 200 includes a MESFET 210 having a control terminal 220 and a driver 215 coupled between a driver supply voltage Vd and the control terminal 220. A gate-to-source voltage Vgs is illustrated at the control terminal 220 of the MESFET 210.

The MESFET 210 is an N-channel device having a nominal gate-to-source intrinsic capacitance Cgs. Additionally, the MESFET 210 has an equivalent gate-to-source, intrinsic body diode Dgs. Both the intrinsic capacitance Cgs and the intrinsic body diode Dgs are drawn explicitly in FIG. 2 to facilitate a discussion of the operation of the integrated circuit 200. The driver 215 includes a bias capacitor Cbias having a bias voltage Vbias and first, second, third, fourth and fifth driver diodes D1, D2, D3, D4, D5, which are collectively designated as the driver diodes D1–D5. Both the bias capacitor Cbias and the driver diodes D1–D5 are preferably integrated with the MESFET 210. In the illustrated embodiment, the MESFET 210 is a Gallium Arsenide MESFET (GaAsMESFET).

The MESFET 210, being an N-Channel device, requires a negative gate-to-source voltage Vgs to bias the MESFET 210 into a non-conduction state. Alternatively, the MESFET 210 requires a positive gate-to-source voltage Vgs to fully enhance the channel into a conduction state. The driver 215 cooperates with the intrinsic components of the MESFET 210 to provide both a negative bias for the non-conduction state and a positive bias for the conduction state. The driver 215 thereby eliminates the need for an external negative bias supply for the MESFET 210. Additionally, the driver 215 may be appropriately rearranged as to provide the same functionality for a MESFET having an opposite polarity (e.g., a P-Channel instead of an N-Channel as shown).

When the MESFET 210 is in the conduction state, the intrinsic body diode Dgs limits the gate-to-source voltage Vgs to about 0.5–0.8 volts. During this period, the driver supply voltage Vd is in a HIGH state providing a positive voltage to the driver 215. A minimum condition for the difference in voltage between the HIGH state and the LOW state of the driver supply voltage Vd is partially determined by the number of diodes included in the driver diodes D1–D5. In the illustrated embodiment, five diodes are chosen to provide a value of about 3.4 volts (0.68 volts per diode times five diodes) for the bias voltage Vbias across the bias capacitor Cbias at the required forward current for the driver diodes D1–D5. Of course, other methods of providing the bias capacitor voltage could be used. For example, a reverse biased zener diode may be used in place of one or more of the driver diodes D1–D5. Additionally, a silicon band gap reference could be used, or perhaps a resistor. Alternative devices used in place of or in addition to driver diodes D1–D5 to generate the bias voltage Vbias are within the spirit and scope of the present invention. The minimum differential HIGH-to-LOW value of the driver supply voltage Vd may be computed to be the bias voltage Vbias (3.4 volts) plus the gate-to-source voltage Vgs (0.5 volts), which is about 3.9 volts. This value of the bias voltage vbias is chosen to assure that the MESFET 210 will be in the conducting state when the driver 215 is in the high condition, and in the non-conduction state when the driver supply voltage Vd traverses to its LOW condition.

The value of the bias capacitor Cbias is dependent on the value of the intrinsic capacitance Cgs of the MESFET 210.

In the illustrated embodiment, the intrinsic capacitance Cgs is about 5 picofarads and the bias capacitor Cbias is selected to be about 20 picofarads. Typically, the value of the bias capacitor Cbias is chosen to be several times the value of the intrinsic capacitance Cgs, up to perhaps ten times the value or more. Choosing the bias capacitor Cbias to be several times the value of the intrinsic capacitance Cgs allows the bias capacitor Cbias to maintain a substantially DC voltage throughout the switching action. The larger the ratio of the bias to intrinsic capacitance, the more stable the DC voltage on the bias capacitor Cbias. This value of bias capacitor Cbias along with the minimum differential HIGH-to-LOW value for the driver supply voltage Vd of 3.9 volts provides a negative bias value of about 3.4 volts for the gate-to-source voltage Vgs when the driver supply voltage Vd shifts from the HIGH to the LOW state. This assures that the MESFET 210 is in a non-conduction state, during this period.

Figure 3:
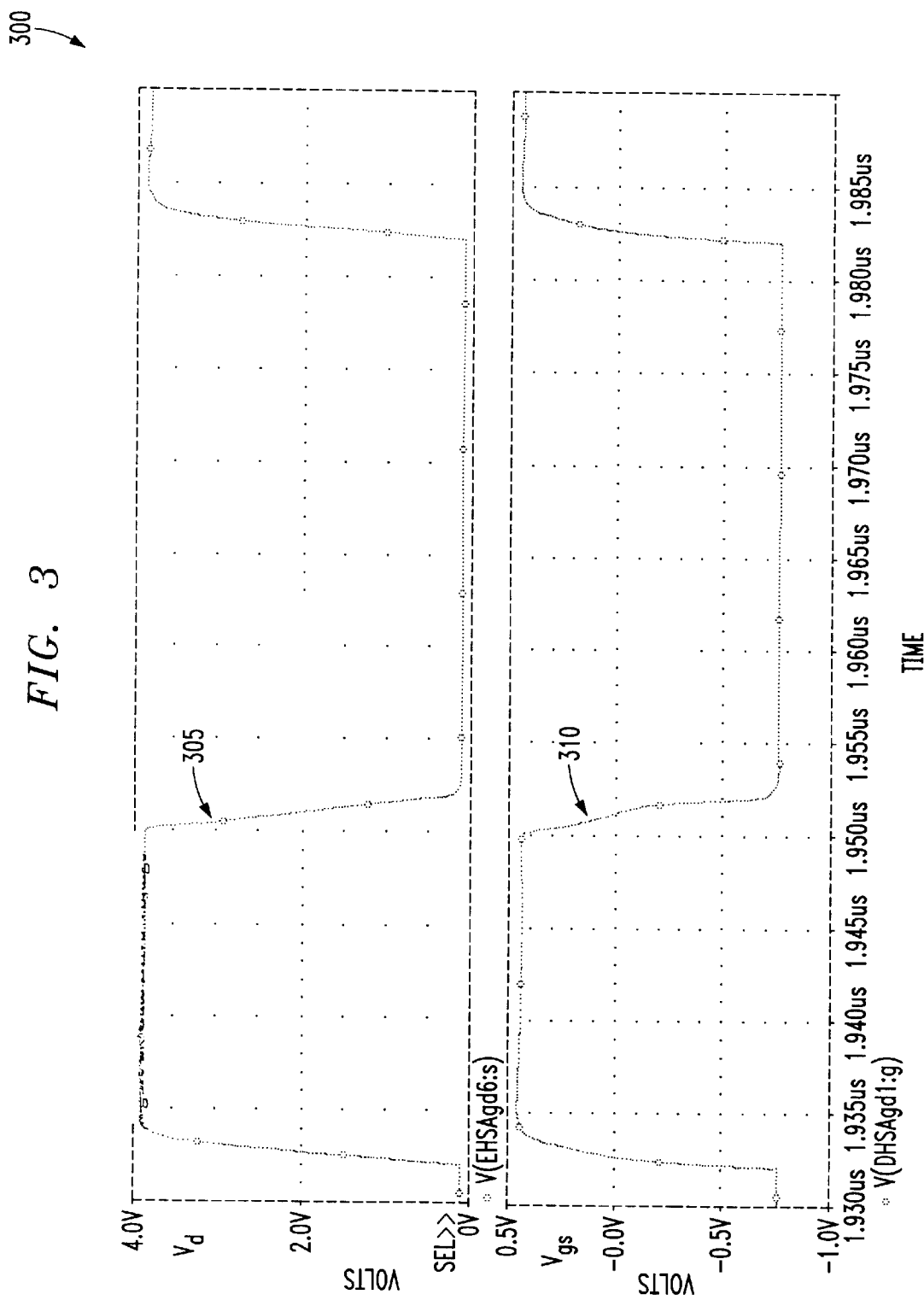
FIG. 3 illustrates voltage waveforms of the integrated circuit of FIG. 2 demonstrating the principles of the present invention.

Turning now to FIG. 3, illustrated are voltage waveforms 300 of the integrated circuit 200 of FIG. 2 demonstrating the principles of the present invention. The voltage waveforms 300 include a first waveform 305 and a second voltage waveform 310. The first voltage waveform 305 corresponds to the driver supply voltage Vd and the second voltage waveform 310 corresponds to the gate-to-source voltage Vgs. The driver supply voltage Vd is seen to initially rise from a LOW state of about zero volts to a HIGH state of about 3.9 volts. This action causes the gate-to-source voltage Vgs also to rise from about —0.8 volts to about 0.5 volts thereby placing the MESFET 210 of FIG. 2 into the conduction state. This state is maintained until the driver supply voltage Vd falls to its LOW state of about zero volts again, and the gate-to-source voltage Vgs again moves to a value of about —0.8 volts placing the MESFET 210 into the non-conduction state. This sequence repeats on a periodic basis. Of course, the aforementioned values are submitted for illustrative purposes only.

Figure 4:
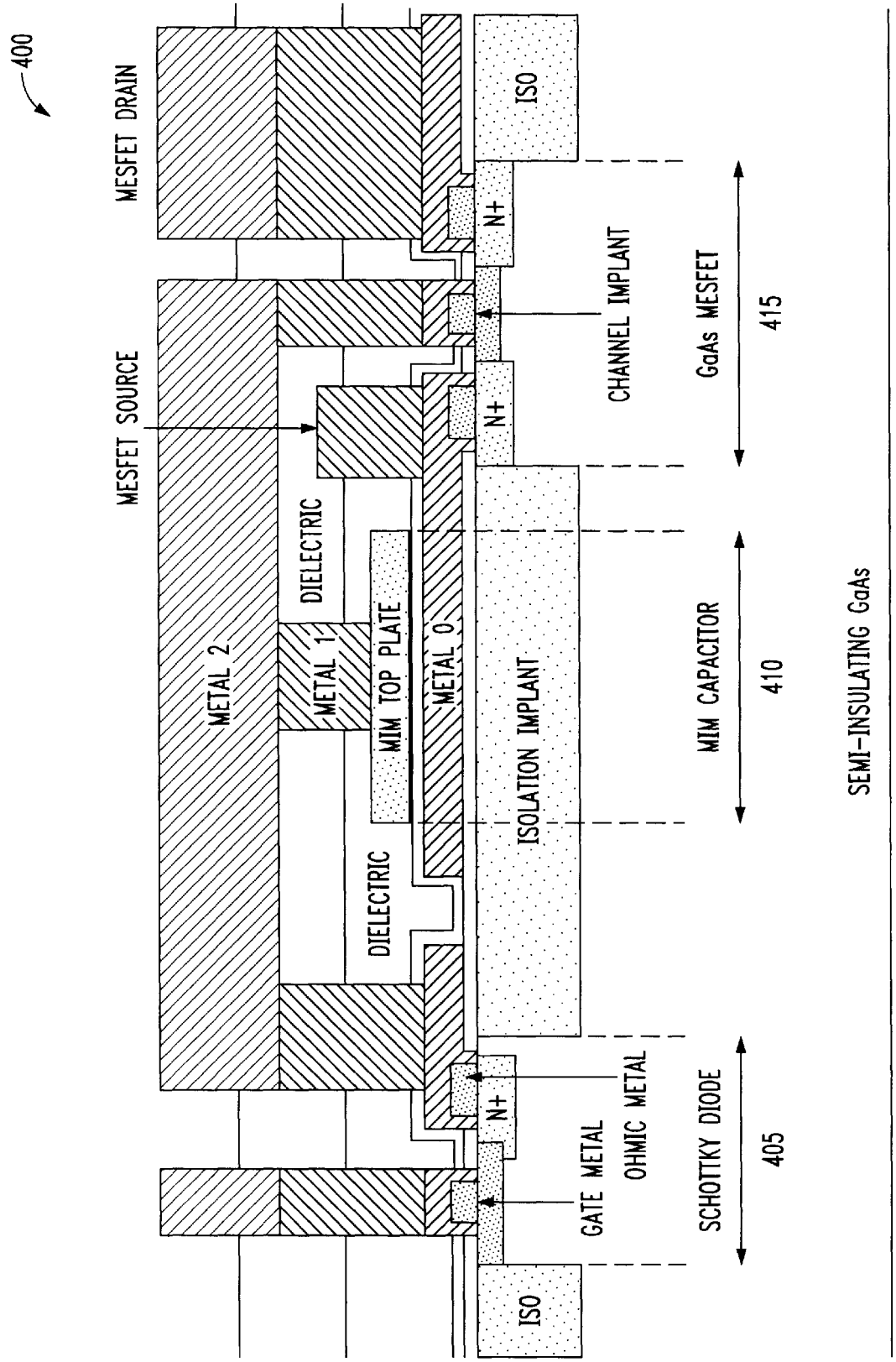
FIG. 4 illustrates a diagram of an embodiment of an integrated circuit constructed according to the principles of the present invention.

Turning now to FIG. 4, illustrated is a diagram of an embodiment of an integrated circuit (e.g., a power switch integrated circuit) 400 constructed according to the principles of the present invention. The power switch integrated circuit 400 includes a Schottky diode 405, a Metal-Insulator-Metal (MIM) capacitor 410 and a power GaAsMESFET 415. In the illustrated embodiment, the Schottky diode 405 and the MIM capacitor 410 are coupled to provide a driver circuit for the power GaAsMESFET 415, wherein only one exemplary Schottky diode is shown.

The power switch integrated circuit 400 may be constructed according to the following process starting with providing a semi-insulating GaAs substrate. Implanted N+ contact regions are formed in the substrate to provide contacts for the Schottky diode 405 and the power GaAs-MESFET 415. A channel implant region is constructed for the power GaAsMESFET 415. Isolation implant regions are provided to underlie all passive devices and surround all active devices. An ohmic metal (such as Germanium/Gold/Nickel) is evaporated over the N+ contact regions and the ohmic metal is alloyed, which melts the ohmic metal into the N+ contact region thereby creating a low contact resistance. A gate metal (such as Titanium/Platinum/Gold) is evaporated to form a gate of the power GaAsMESFET 415.

A Metal 0 (such as Titanium/Platinum/Gold) is deposited and patterned by lift off on the ohmic contacts and the gate metal. The Metal 0 is also used as the bottom plate for the MIM capacitor. A MIM capacitor dielectric is formed and a MIM capacitor top plate metal (such as Titanium/Platinum/Gold) is deposited and patterned by lift-off. A second dielectric material is then deposited and cured. Vias are etched through to the MIM capacitor top metal and the Metal 0 layers. The vias are coated with a thin field metal (such as Titanium/Gold) to provide electrical contact for plating, and the vias are plated with gold (i.e., Metal 1). The Metal 1 provides a top side contact for the Metal 0 and the MIM capacitor top metal. A Metal 2 is formed to provide an interconnect from the Schottky diode 405 to the top plate of the MIM capacitor 410 and the gate of the power GaAs-MESFET 415.

Although the present invention and its advantages have been described in detail, those skilled in the art should understand that they can make various changes, substitutions and alterations herein without departing from the spirit and scope of the invention in its broadest form.

What is claimed is:

1. An integrated circuit, comprising:
   a metal-semiconductor field-effect transistor (MESFET) having a nominal intrinsic capacitance and requiring a negative voltage to bias said MESFET into a non-conduction state; and
   a driver including a bias capacitor integrated with said MESFET and configured to:
      apply a positive voltage to bias said MESFET into a conduction state, and
      apply said negative voltage to bias said MESFET into said non-conduction state without employing an external negative bias source.

2. The integrated circuit as recited in claim 1 wherein said driver further comprises at least one diode.

3. The integrated circuit as recited in claim 2 wherein said at least one diode is parallel-coupled to said bias capacitor.

4. The integrated circuit as recited in claim 1 wherein said driver is coupled to a control terminal of said MESFET.

5. The integrated circuit as recited in claim 1 wherein said MESFET is a Gallium-Arsenide metal-semiconductor field-effect transistor (GaAsMESFET).

6. The integrated circuit as recited in claim 1 wherein said integrated circuit forms a portion of a power converter.

7. The integrated circuit as recited in claim 6 wherein said power converter is selected from the group consisting of:
   a boost power converter,
   a buck power converter, and
   a buck-boost power converter.

8. A method of driving a metal-semiconductor field-effect transistor (MESFET) having a nominal intrinsic capacitance and requiring a negative voltage to bias said MESFET into a non-conduction state, comprising:
   establishing one of a positive and negative voltage across a bias capacitor, integrated with said MESFET, to drive said MESFET;
   applying said positive voltage to bias said MESFET into a conduction state; and
   applying said negative voltage to bias said MESFET into said non-conduction state without employing an external negative bias source.

9. The method as recited in claim 8 wherein said establishing is performed in cooperation with at least one diode.

10. The method as recited in claim 9 wherein said at least one diode is parallel-coupled to said bias capacitor.

11. The method as recited in claim 10 wherein said parallel-coupled bias capacitor and at least one diode are coupled to a control terminal of said MESFET.

12. The method as recited in claim 8 wherein said MESFET is a Gallium-Arsenide metal-semiconductor field-effect transistor (GaAsMESFET).

13. The method as recited in claim 8 wherein said MESFET forms a portion of a power converter.

14. The method as recited in claim 13 wherein said power converter is selected from the group consisting of:
- a boost power converter,
- a buck power converter, and
- a buck-boost power converter.

15. A power converter having an input and an output, comprising:
- an inverter, coupled to said input, having a power switch integrated circuit including:
  - a power metal-semiconductor field-effect transistor (MESFET) having a nominal intrinsic capacitance and requiring a negative voltage to bias said power MESFET into a non-conduction state; and
  - a power MESFET driver including a power MESFET driver bias capacitor integrated with said power MESFET and configured to:
    - apply a positive voltage to bias said power MESFET into a conduction state, and
    - apply said negative voltage to bias said power MESFET into said non-conduction state without employing an external negative bias source;
- a rectifier, interposed between said inverter and said output, having a rectifier switch integrated circuit including:
  - a rectifier MESFET having a nominal intrinsic capacitance and requiring said negative voltage to bias said rectifier MESFET into said non-conduction state; and
  - a rectifier MESFET driver including a rectifier MESFET driver bias capacitor integrated with said rectifier MESFET and configured to:
    - apply said positive voltage to bias said rectifier MESFET into said conduction state, and
    - apply said negative voltage to bias said rectifier MESFET into said non-conduction state without employing said external negative bias source; and
- a control circuit, coupled to said inverter and rectifier, configured to control at least one of said power MESFET and rectifier MESFET.

16. The power converter as recited in claim 15 wherein each of said power MESFET driver and rectifier MESFET driver further comprises at least one diode.

17. The power converter as recited in claim 15 further comprising a transformer, interposed between said inverter and rectifier, and said inverter further comprises an active clamp having clamp switch integrated circuit including:
- a clamp MESFET having a nominal intrinsic capacitance and requiring said negative voltage to bias said clamp MESFET into said non-conduction state; and
- a clamp MESFET driver including a clamp MESFET driver bias capacitor integrated with said clamp MESFET and configured to:
  - apply said positive voltage to bias said clamp MESFET into said conduction state, and
  - apply said negative voltage to bias said clamp MESFET into said non-conduction state without employing said external negative bias source.

18. The power converter as recited in claim 15 wherein said power MESFET driver and rectifier MESFET driver are coupled to control terminals of said power MESFET and rectifier MESFET, respectively.

19. The power converter as recited in claim 15 wherein said power MESFET and rectifier MESFET are Gallium-Arsenide metal-semiconductor field-effect transistors (GaAsMESFETs).

20. The power converter as recited in claim 15 further comprising an output filter interposed between said rectifier and said output of said power converter.

21. The power converter as recited in claim 15 wherein said power converter is selected from the group consisting of:
- a boost power converter,
- a buck power converter, and
- a buck-boost power converter.

* * * * *